United States Patent
Brunner et al.

(10) Patent No.: US 11,662,262 B2
(45) Date of Patent: May 30, 2023

(54) SENSOR UNIT AND METHOD OF INTERCONNECTING A SUBSTRATE AND A CARRIER

(71) Applicant: TE Connectivity Solutions GmbH, Steinach (CH)

(72) Inventors: Ismael Brunner, Steinach (CH); Thomas Arnold, Steinach (CH); Predrag Drljaca, Steinach (CH)

(73) Assignee: TE Connectivity Solutions GmbH, Schaffhausen (CH)

( * ) Notice: Subject to any disclaimer, the term of this patent is extended or adjusted under 35 U.S.C. 154(b) by 0 days.

(21) Appl. No.: 16/739,815

(22) Filed: Jan. 10, 2020

(65) Prior Publication Data

US 2020/0225107 A1 Jul. 16, 2020

(30) Foreign Application Priority Data

Jan. 10, 2019 (EP) .................................... 19151102

(51) Int. Cl.
*G01L 9/00* (2006.01)
*G01L 7/00* (2006.01)
(Continued)

(52) U.S. Cl.
CPC .............. *G01L 7/08* (2013.01); *B81B 3/0064* (2013.01); *G01L 9/0019* (2013.01); *G01L 9/0042* (2013.01); *B81B 2201/0264* (2013.01)

(58) Field of Classification Search
CPC ..... G01L 19/147; G01L 9/0042; G01L 19/04; G01L 9/0054; G01L 9/0072; G01L 13/025; G01L 19/14; G01L 19/0038; G01L 19/0084; G01L 9/0055; G01L 9/0075; G01L 19/0069; G01L 9/0052; G01L 9/0073; G01L 19/0092; G01L 19/0618; G01L 19/0645; G01L 19/143;
(Continued)

(56) References Cited

U.S. PATENT DOCUMENTS

2005/0082653 A1 4/2005 McWilliams et al.
2015/0060954 A1 3/2015 Cheng et al.
(Continued)

OTHER PUBLICATIONS

Extended European Search Report, European Application No. 19151102.1-1230, dated Jul. 12, 2019.

*Primary Examiner* — Andre J Allen
(74) *Attorney, Agent, or Firm* — Barley Snyder

(57) ABSTRACT

A sensor unit includes a transducer element monitoring a measurand and generating an electrical output signal correlated with the measurand, a sensor substrate having a first surface and an opposite second surface, a recess extending from the first surface of the substrate through to the second surface of the substrate, and a circuit carrier. The transducer element and a first electrically conductive contact pad are arranged on the first surface and electrically connected. The circuit carrier has a second electrically conductive contact pad. The sensor substrate is mounted on the circuit carrier with the first surface facing the circuit carrier. The first electrically conductive contact pad and the second electrically conductive contact pad are interconnected by an electrically conductive material filled in from the second surface towards the first surface of the sensor substrate.

19 Claims, 15 Drawing Sheets

(51) Int. Cl.
*B81B 3/00* (2006.01)
*G01L 7/08* (2006.01)

(58) Field of Classification Search
CPC .............. G01L 9/0051; G01L 19/0007; G01L 19/0046; G01L 19/06; G01L 19/0627; G01L 19/0681; G01L 27/002; G01L 9/00; G01L 9/0041; G01L 9/0044; G01L 11/025; G01L 11/04; G01L 19/0023; G01L 19/0672; G01L 19/069; G01L 19/142; G01L 19/145; G01L 19/16; G01L 7/00; G01L 9/0047; G01L 9/06; G01L 9/065; G01L 9/12; G01L 11/02; G01L 13/00; G01L 15/00; G01L 19/0015; G01L 19/003; G01L 19/02; G01L 19/0609; G01L 19/083; G01L 19/10; G01L 19/148; G01L 27/005; G01L 7/08; G01L 7/082; G01L 7/163; G01L 7/166; G01L 9/0045; G01L 9/0048; G01L 9/006; G01L 9/007; G01L 9/0076; G01L 9/04; G01L 9/045; G01L 9/125; G01L 11/00; G01L 17/00; G01L 19/00; G01L 19/0076; G01L 19/08; G01L 19/141; G01L 19/146; G01L 1/142; G01L 1/2262; G01L 1/246; G01L 21/12; G01L 23/16; G01L 27/007; G01L 7/04; G01L 7/063; G01L 7/084; G01L 7/086; G01L 7/16; G01L 9/0002; G01L 9/0007; G01L 9/0016; G01L 9/0019; G01L 9/0022; G01L 9/0027; G01L 9/0033; G01L 9/0039; G01L 9/005; G01L 9/0058; G01L 9/0077; G01L 9/0079; G01L 9/008; G01L 9/0092; G01L 9/0095; G01L 9/025; G01L 9/08; G01L 9/085; G01L 9/105; G01L 9/14; G01L 9/16; H01L 2224/48091; H01L 2924/00014; H01L 2224/48137; H01L 2224/48145; H01L 2224/73265; H01L 2924/00012; H01L 2224/04105; H01L 2224/24137; H01L 2224/49175; H01L 24/19; H01L 2924/1461; H01L 2924/1815; H01L 2924/18162; H01L 29/84; H01L 41/047; H01L 41/0475; H01L 41/1132
USPC .................................... 73/700–756
See application file for complete search history.

(56) References Cited

U.S. PATENT DOCUMENTS

| | | | |
|---|---|---|---|
| 2016/0056056 A1* | 2/2016 | Chen | H01L 24/97 257/774 |
| 2016/0056126 A1* | 2/2016 | Yu | H01L 21/565 257/737 |
| 2016/0322336 A1* | 11/2016 | Tu | H01L 25/50 |
| 2016/0322337 A1* | 11/2016 | Liang | H01L 24/05 |
| 2017/0033063 A1* | 2/2017 | Lin | H01L 21/561 |

* cited by examiner

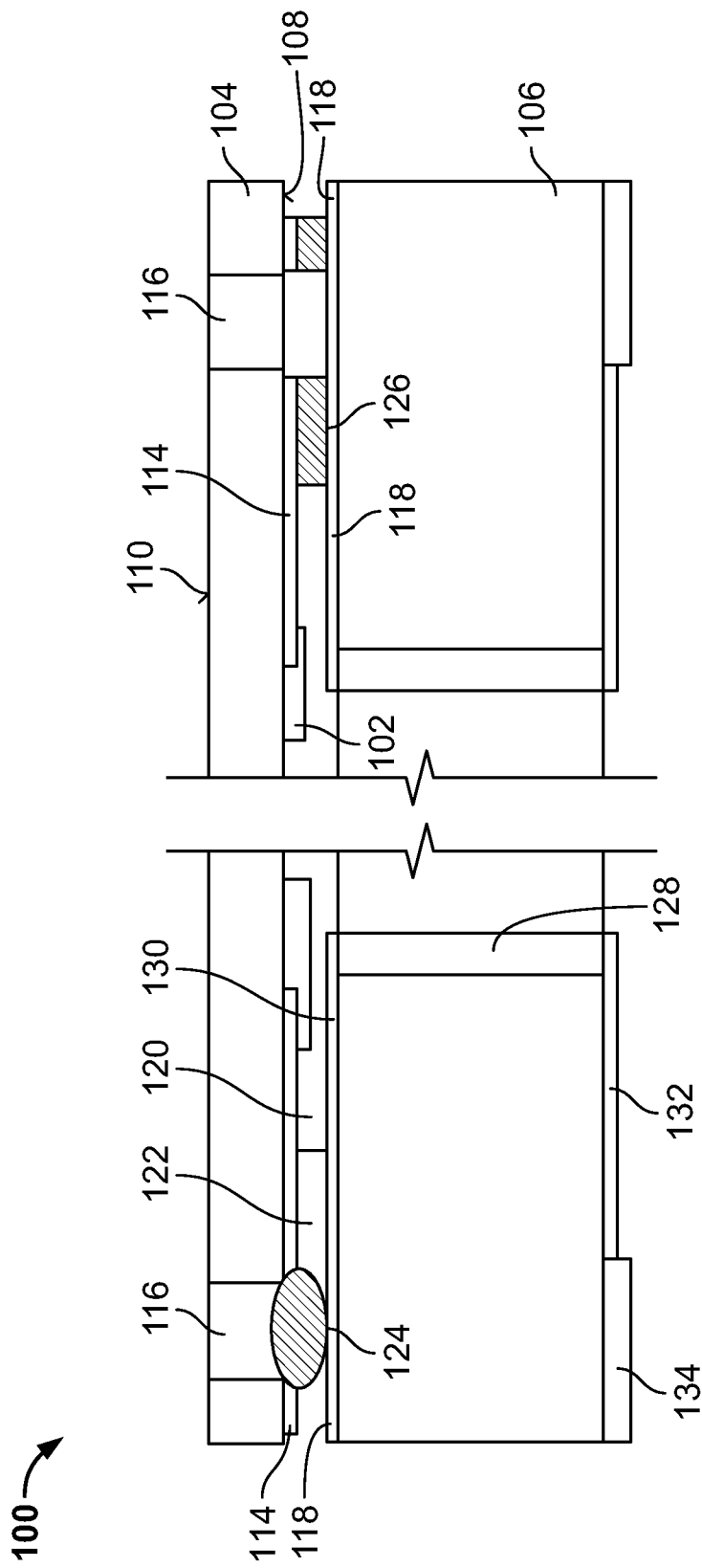

SENSOR UNIT AND METHOD OF INTERCONNECTING A SUBSTRATE AND A CARRIER

CROSS-REFERENCE TO RELATED APPLICATION

This application claims the benefit of the filing date under 35 U.S.C. § 119(a)-(d) of European Patent Application No. 19151102, filed on Jan. 10, 2019.

FIELD OF THE INVENTION

The present invention relates to a sensor unit and, more particularly, to a sensor unit having a transducer element.

BACKGROUND

In automotive applications, a plurality of measurands are to be monitored; physical ones such as pressure or temperature as well as electrochemical ones such as gas concentrations (e.g. $CO_2$). The medium which is to be monitored has to gain access to defined sensitive elements of a sensor arrangement while also ensuring that the aggressive and humid environment does not damage and/or impair the electronic components of the sensor arrangement. Moreover, the sensor unit must be capable of fabrication in high volume mass production, requiring an efficient assembly procedure.

Conventionally, sensor units comprise at least one transducer element for monitoring at least one measurand and generating an electrical output signal correlated with the at least one measurand, the one or more transducer element(s) being arranged on a first surface of a sensor substrate.

The sensor substrate usually is rather thin and is also referred to as a membrane, such as a ceramic membrane. The membrane must be attached to a (usually thicker) circuit carrier. Electrical connections must be established between the transducer element(s) and contact pads arranged on the circuit carrier. Additionally, a solder joint can also connect any other kind of electric or electronic element (e.g. one or more sensors, trimming resistors, or the like) located on top of the substrate (or second surface). The electrical connection is formed by metallization of the walls of the opening or recess. This is usually a complicated fabrication process, or involves the risk of damaging the sensor substrate by mechanical stress.

SUMMARY

A sensor unit includes a transducer element monitoring a measurand and generating an electrical output signal correlated with the measurand, a sensor substrate having a first surface and an opposite second surface, a recess extending from the first surface of the substrate through to the second surface of the substrate, and a circuit carrier. The transducer element and a first electrically conductive contact pad are arranged on the first surface and electrically connected. The circuit carrier has a second electrically conductive contact pad. The sensor substrate is mounted on the circuit carrier with the first surface facing the circuit carrier. The first electrically conductive contact pad and the second electrically conductive contact pad are interconnected by an electrically conductive material filled in from the second surface towards the first surface of the sensor substrate.

BRIEF DESCRIPTION OF THE DRAWINGS

The invention will now be described by way of example with reference to the accompanying Figures, of which:

FIG. 2A is a sectional side view of the sensor unit of FIG. 1 before solder reflow;

FIG. 2B is a sectional side view of the sensor unit of FIG. 1 after solder reflow;

DETAILED DESCRIPTION OF THE EMBODIMENT(S)

Figure 1:
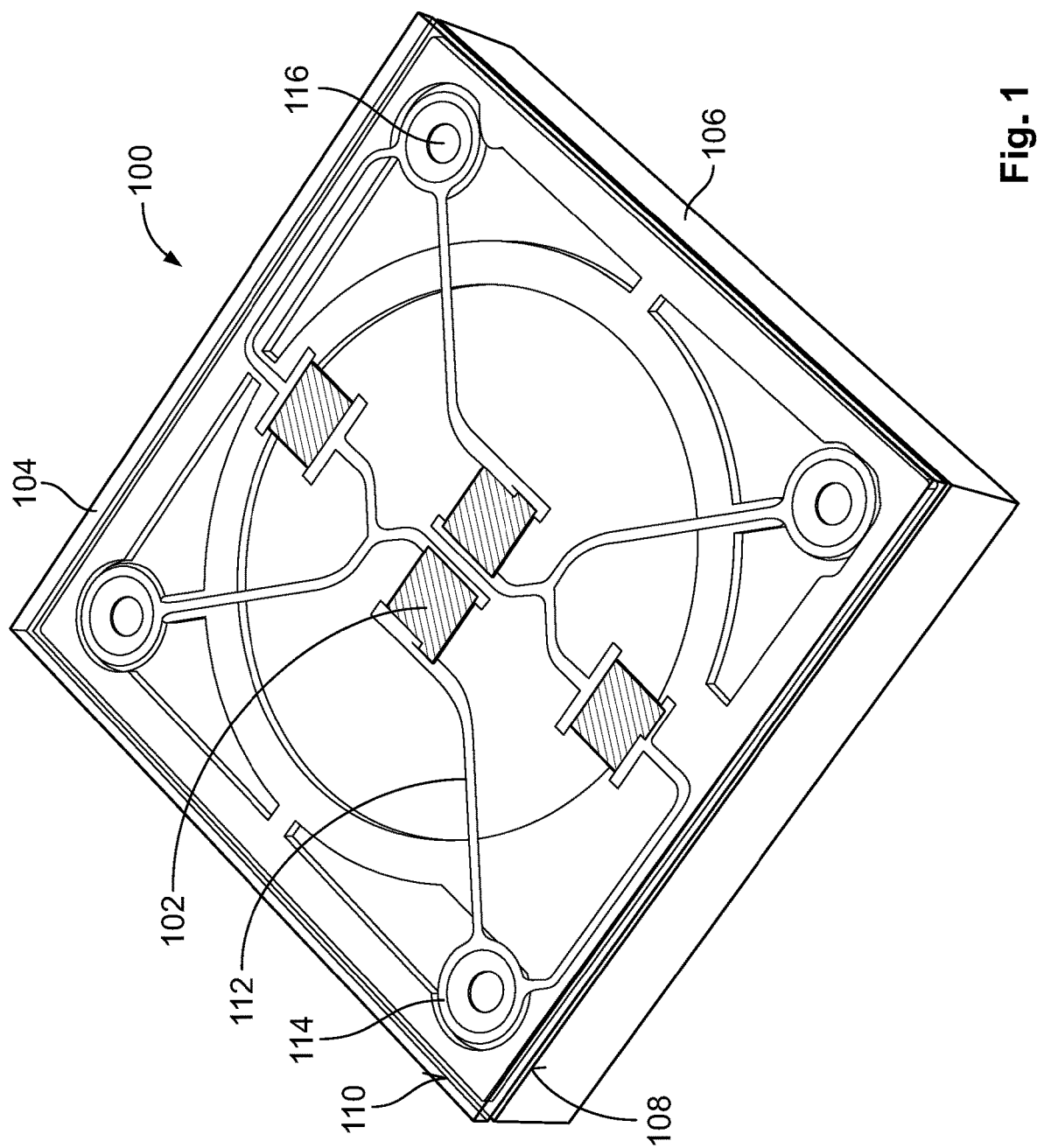
FIG. 1 is a perspective view of a sensor unit according to an embodiment.

Exemplary embodiments of the present invention will be described hereinafter in detail with reference to the attached drawings, wherein like reference numerals refer to like elements. The present invention may, however, be embodied in many different forms and should not be construed as being limited to the embodiments set forth herein. Rather, these embodiments are provided so that the present disclosure will convey the concept of the invention to those skilled in the art.

A sensor unit 100 according to an embodiment, as shown in FIG. 1, comprises a sensor substrate 104 mounted on a circuit carrier 106, which is for instance fabricated from alumina. The sensor substrate 104 has a first surface 108 which is on an under side shown in FIG. 1 and faces the circuit carrier 106, and a second surface 110 which is on an upper side as shown in FIG. 1. The sensor substrate 104 is depicted as being transparent in FIG. 1.

In the context of the present invention, the term "circuit carrier" is intended to encompass any sort of substrate having electrically conductive leads on which the sensor substrate 104 (and optionally further electronic components) can be mounted. In particular, the circuit carrier 106 may comprise a printed circuit board (PCB), a flexible circuit carrier (also called flexible printed circuit, FPC), a flex-rigid carrier (which is a combination of an FPC or a flat flexible cable with rigid elements), a ceramic substrate (thick film, LTCC, HTCC), glass, or the like. Moreover, the term "substrate" (or "sensor substrate") may also cover a PCB, an FPC, a flex-rigid carrier, a ceramic substrate (thick film, LTCC, HTCC), glass, or the like. In an embodiment, the sensor substrate 104 and/or the circuit carrier 106 are a ceramic chip carrier.

The sensor unit 100 is a pressure sensor and includes a plurality of piezoresistive strain gauges, four in the shown embodiment, which form transducer elements 102 as shown in FIG. 1. The sensor substrate 104 forms a displaceable membrane. The transducer elements 102 are arranged on the first surface 108 of the sensor substrate 104. The circuit carrier 106 may have an opening penetrating the circuit carrier 106 and thus forming a media access channel below the transducer elements 102. Alternatively, the media access is from the upper side 110 with an additional housing (not shown). The strain gauges detect the displacement of the membrane 104 due to a pressure difference between the two surfaces 108, 110 of the membrane 104. The transducer elements 102 monitor a measurand and generate an electrical output signal correlated with the measurand.

In an embodiment, each of the transducer elements 102 is a microelectromechanical system (MEMS) gas sensor and/or a MEMS pressure sensor, in particular for automotive applications. In other embodiments, the transducer elements 102 may be any kind requiring direct contact with a media to be monitored.

As shown in FIG. 1, the transducing elements 102 are connected to electrically conductive leads 112. In an embodiment, the electrically conductive leads 112 are formed from silver or a silver alloy. The leads 112 are connected to electrically conductive first contact pads 114.

At each contact pad 114, as shown in FIG. 1, the sensor unit 100 has a circular recess 116, which penetrates the sensor substrate 104 from the second surface 110 to the first surface 108. The diameters of the recesses 116 are large enough to allow solder material to be filled in by screen printing or other dispensing techniques and reach corresponding second electrically conductive contact pads 118 which are arranged on the circuit carrier 106 (not visible in FIG. 1). By a reflow soldering, a firm electrical connection can be established between the first and the second electrically conductive contact pads 114, 118. Screen printing (or otherwise dispensing) the solder paste can be performed after the membrane-substrate assembly. This further allows processing at panel level, saving costs.

In an embodiment, a solderable precursor is for instance screen printed into the recesses 116 after the sensor substrate 104 has been aligned on the circuit carrier 106, so that the solderable contact pads 114, 118 of the sensor substrate 104 and of the circuit carrier 106 are aligned with each other. Next, the sensor unit 100 is heated up until the precursor material reaches a liquid state. After cooling down, the solder connections are established, forming the electrical connections between the circuit carrier 106 and the sensor substrate 104. In other embodiments, conductive glues or any other electrically conductive material that has a temporary fluid state, such as a silver filled epoxy, may also be used.

In the embodiment shown in FIG. 1, the contact pads 114, 118 and the recesses 116 are distanced apart from the edges of the sensor unit 100 and are formed by tube-shaped openings which have a closed circular diameter. The cross-section of the recesses 116 does not necessarily have to be circular, but in other embodiments may also be rectangular or have any other suitable shape.

FIG. 2A shows the state of the sensor unit 100 after the solderable material has been applied, but has not yet been heated. FIG. 2B shows the final state of the sensor unit 100 after the reflow heating step has been performed.

As shown in FIGS. 2A and 2B, the piezoresistive gauges 102 are covered or at least partially encompassed by a protective glass layer 120. The protective glass layer 120 is attached to the first surface 108 of the sensor substrate 104. The protective glass layer 120 forms a narrow gap 122 between the first contact pads 114 and the second electrically conductive contact pads 118.

The solder paste 124 is filled into the recess 116 in a direction from the second surface 110 towards the first surface 108 and reaches the second electrically conductive contact pads 118, as shown in FIG. 2A. When applying heat to the sensor unit 100, the solder paste 124 liquefies and is drawn by capillary forces into the gap 122, thereby forming a solder connection 126 between the first and the second electrically conductive contact pads 114, 118, shown in FIG. 2B.

The process of applying the electrically conductive material can be performed from the backside of the sensor substrate 104 and with the circuit carrier 106 as a mechanical support. In this manner, the sensor substrate 104 and the transducer elements 102 are protected and the fabrication process is facilitated.

The circuit carrier 106 further comprises metallized vias 128 which connect second electrically connected leads 130 arranged on the upper surface of the circuit carrier 106 to electrically conductive leads 132 connected with terminal 134. The terminal 134 permits connection of the sensor unit 100 to an external component. In an embodiment, the terminal 134 is formed by a surface mount technology (SMT) terminal. In an embodiment, the electrical connection between the terminal 134 and the second contacts pads 118 is established simultaneously with the reflow soldering.

According to the embodiment shown in FIGS. 2A and 2B, the via 128 is located at some distance apart from the first and second electrically conductive contact pads 114, 118. The via 128 has a closed cross-section. In an embodiment, the via 128 has a circular cross-section, and could have any other polygonal cross-section.

Figure 4:
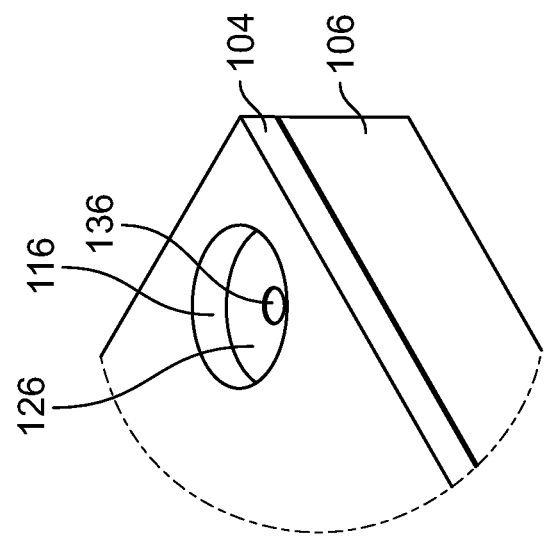
FIG. 4 is a detail of the perspective view of FIG. 1, with the substrate and the circuit carrier of the sensor unit solid.
Figure 3:
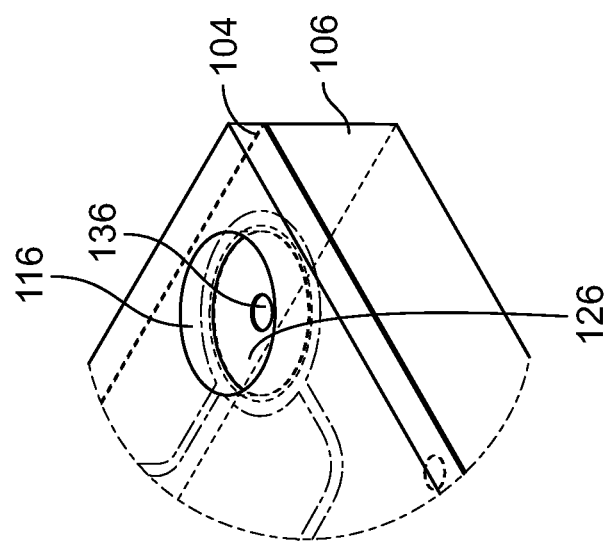
FIG. 3 is a detail of the perspective view of FIG. 1, with a substrate and a circuit carrier of the sensor unit transparent.

FIGS. 3 and 4 illustrate a region of the recesses 116 as a detail; FIG. 3 shows the sensor substrate 104 and the circuit carrier 106 transparent. As shown in FIGS. 3 and 4, the solder connection 126 does not cover the complete contact pad 118, but leaves an uncovered region 136. The solder connection 126 forms a ring-shaped electrically conductive connection between the first and second electrically conductive contact pads 114, 118. This shape is created because, during the heating step, the liquefied solder is drawn by capillary forces into the gap 122 between the sensor substrate 104 and the circuit carrier 106.

Figure 5:
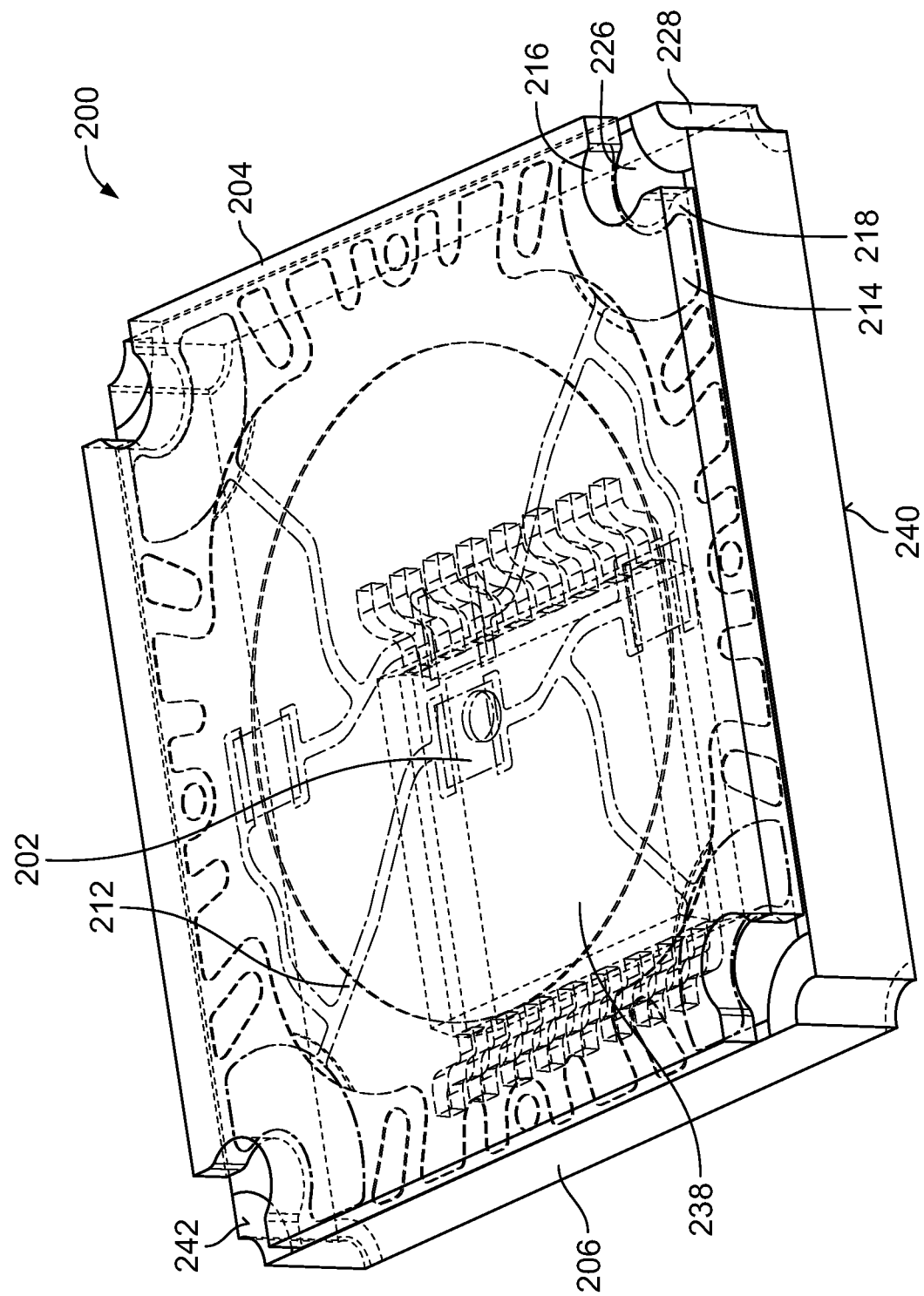
FIG. 5 is a perspective view of a sensor unit according to another embodiment.

A sensor unit 200 according to another embodiment is shown in FIG. 5. The sensor unit 200 differs from the sensor unit 100 explained above mainly in the location of the solder connections 226 and the vias 228. The sensor unit 200 includes a sensor substrate 204 which is attached to a circuit carrier 206. A plurality of recesses 216, four in the shown embodiment, are arranged at the corners of the sensor unit 200. In other embodiments, a non-symmetrical arrangement of the recesses 216, or an arrangement not at the corner but at the edge of the sensor unit 200, is possible. The recesses 216 have an open cross-section in a circular shape and, in other embodiments, could have other shapes.

As shown in FIG. 5, the recesses 216 and the solder connection 226 are located close to the metallized vias 228. By arranging the first electrically conductive contact pads 214 in close vicinity to the via 228, no additional leads from the second electrically conductive pads 218 to the vias 228 are necessary, which saves space on the circuit carrier 206. Further, when fabricating the sensor unit 200 on a panel level, comparatively large openings can be provided as the recesses 216, thus facilitating filling in the solderable material from the membrane side. The location of the solder connections 226 close to the peripheral region, in particular at the corners of the sensor unit 200, is achieved by separating the individual sensor units 200. The process will become more apparent below with reference to FIGS. 13-15.

As shown in FIG. 5, the sensor unit 200 includes four transducer elements 202 which are connected by electrically conductive leads 212 to the first electrically conductive contact pads 214. Furthermore, an electronic sensing and control circuit 238 is provided at an underside 240 of the circuit carrier 214. The underside 240 is opposed to the surface 242 which faces the substrate 204.

Figure 6B:
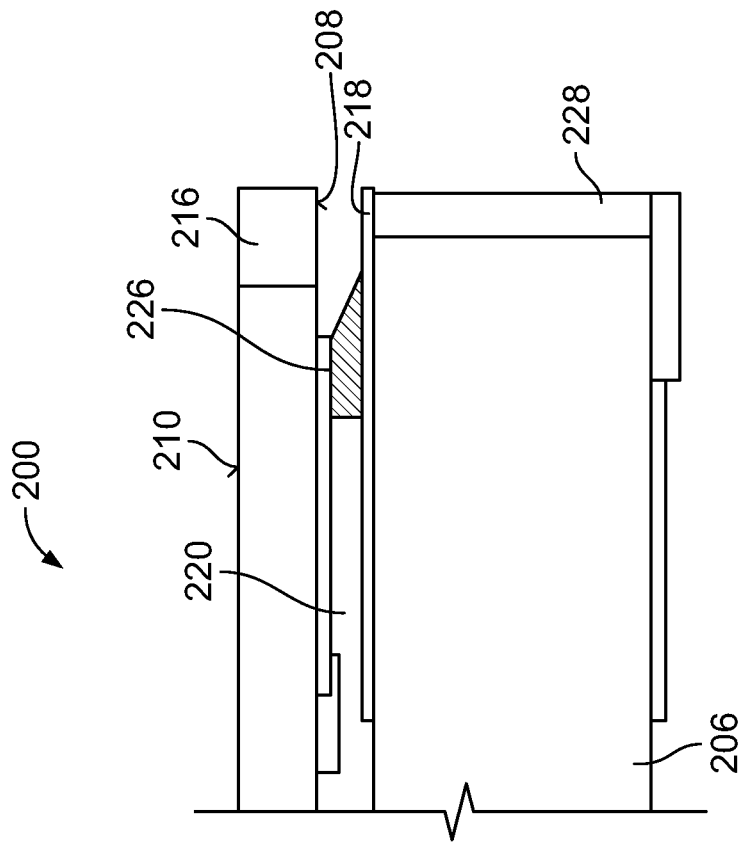
FIG. 6B is a sectional side view of the sensor unit of FIG. 5 after solder reflow.
Figure 6A:
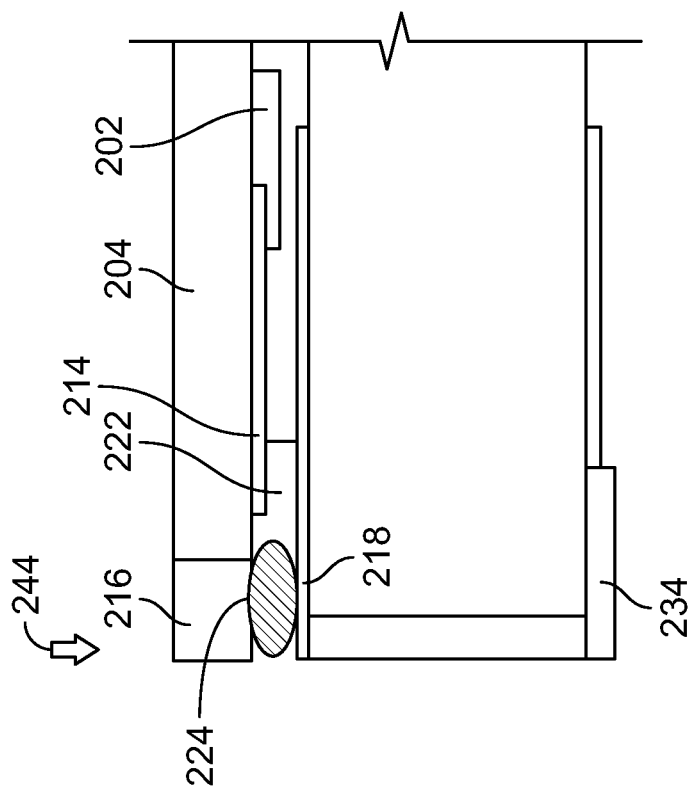
FIG. 6A is a sectional side view of the sensor unit of FIG. 5 before solder reflow.
Figure 9:
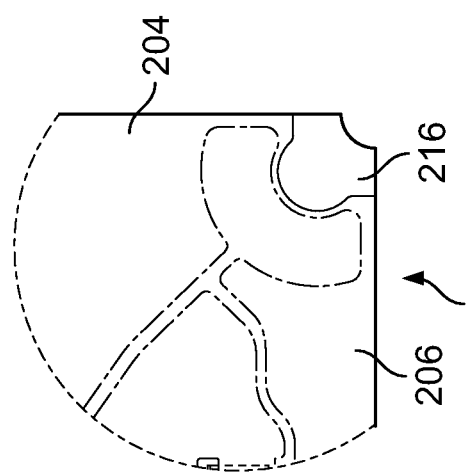
FIG. 9 is a top view of a portion of the sensor unit of FIG. 5.
Figure 8:
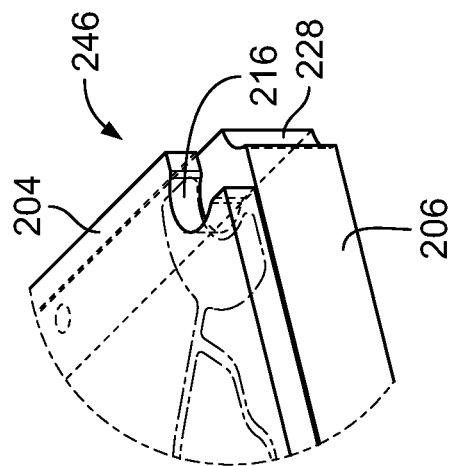
FIG. 8 is a detail of the perspective view of FIG. 1, with the substrate and the circuit carrier of the sensor unit transparent.
Figure 7:
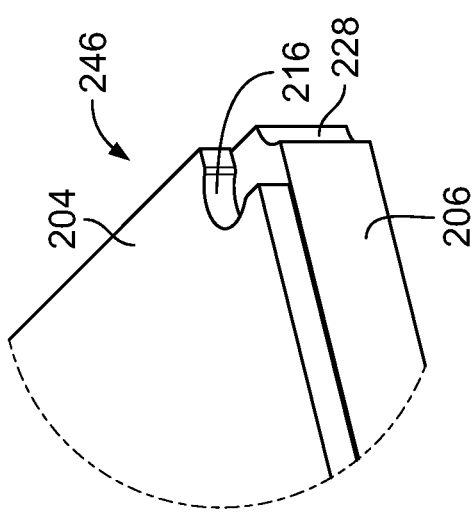
FIG. 7 is a detail of the perspective view of FIG. 5, with a substrate and a circuit carrier of the sensor unit solid.

FIG. 6A shows the sensor unit 200 after the solderable material 224 has been dispensed or screen-printed from the first surface 210 of the substrate 204. FIG. 6B shows the sensor unit after solder reflow, where the solder connection 126 is formed and the sensor substrate 204 is firmly bonded to the circuit carrier 206.

As shown in FIG. 6A, the solderable material 224 is filled in from the surface 210 of the circuit substrate 204 onto the second electrically conductive contact pads 218 as indicated by the arrow 244. A gap 222 is left between the first and second electrically conductive contact pads 214, 218. Consequently, when the sensor unit 200 is heated after the solderable material 224 has been filled in, capillary forces draw the liquefied solderable material 224 towards the protective glass layer 220, forming an electrically conductive bond between the first and the second electrically conductive contact pads 214, 218.

FIGS. 7-10 illustrate several detailed views of a corner region 246 of the sensor unit 200 shown in FIGS. 5 and 6. The recess 216 is located in close vicinity to the via 228. Thereby, the problem arises, that when filling in the solderable material 224, it could be filled into the via 228. In this case, the capillary forces might not be able to draw the liquefied solderable material 224 between the first and the second electrically conductive contact pads 214, 218.

Figure 11:
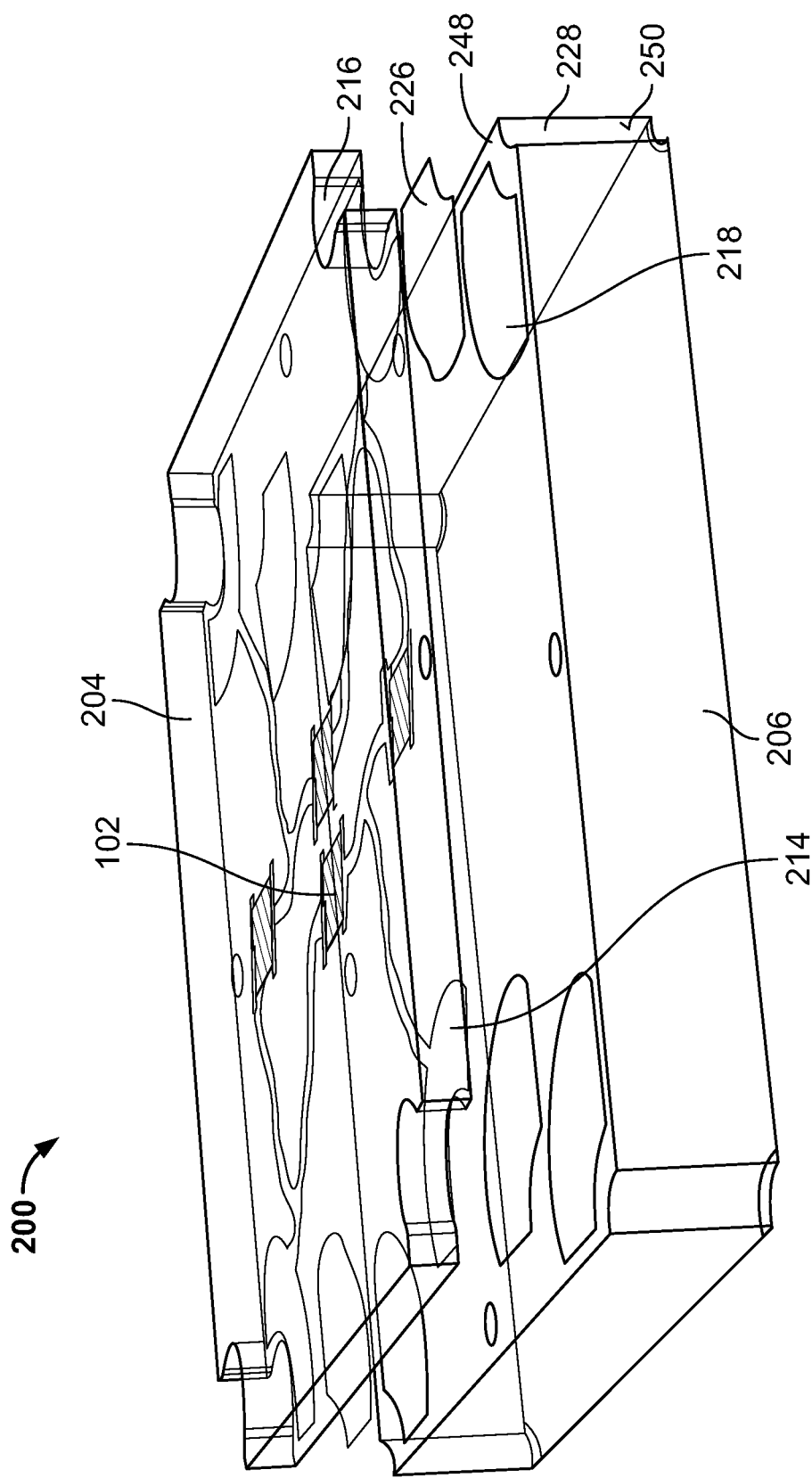
FIG. 11 is a perspective view of a sensor unit according to another embodiment with a sensor substrate and a circuit carrier transparent.
Figure 12:
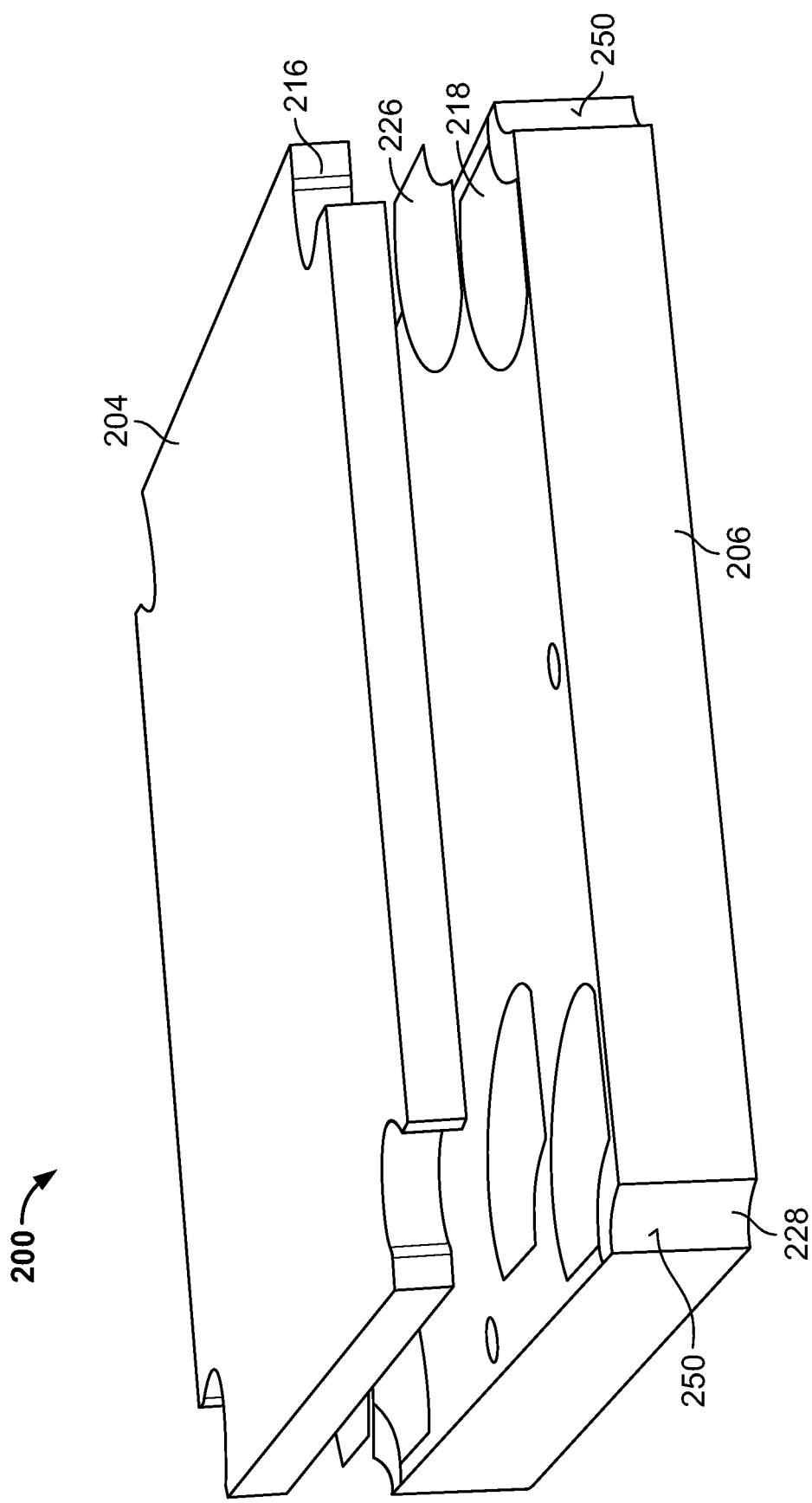
FIG. 12 is a perspective view of the sensor unit of FIG. 11 with the sensor substrate and the circuit carrier solid.

A possibility to overcome this drawback is shown in FIGS. 11 and 12. According to this embodiment, solder free areas 248 are provided directly adjacent to the via 228. In an embodiment, these solder free areas 248 are part of a dielectric coating 250 which covers the via 228.

Figure 14:
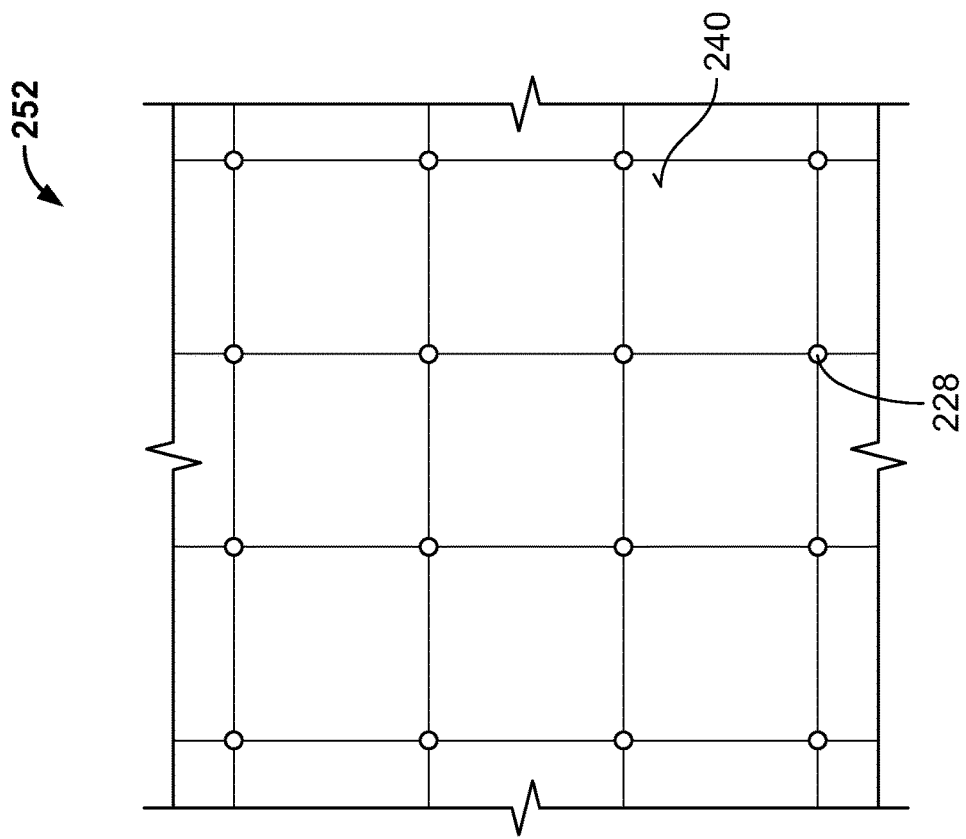
FIG. 14 is a plan view of an underside of the panel layout pattern of FIG. 13.
Figure 13:
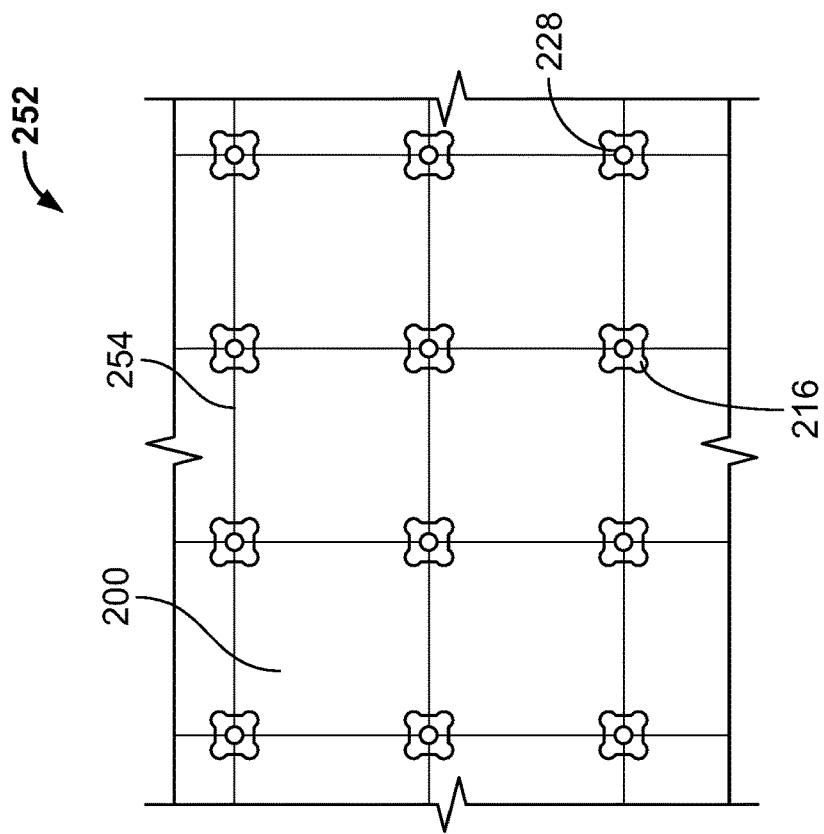
FIG. 13 is a plan view of an upper side of a panel layout pattern according to an embodiment.

A fabrication process of the sensor unit 200 on a panel level is shown in FIGS. 13 and 14. In FIG. 13, a top view of the panel 252 with the attached sensor substrate is shown. A plurality of not yet individualized sensor units 200 are arranged side by side. A plurality of later corner regions 246 are located at the intersections of a plurality of die cutting lines 254. By the later cutting process, each sensor unit 200 has a via 228 with the quarter-circle shaped cross-section. As already mentioned above, the via may also lie along the die cutting lines 254, leaving each sensor unit 200 with a via 228 having a semi-circular cross-section. The number of connections is determined by the particular application. The arrangement of the sensor unit 200 is particularly efficient and space saving. FIG. 14 shows the underside view of the panel, where only the holes of the vias 228 are visible.

Figure 15:
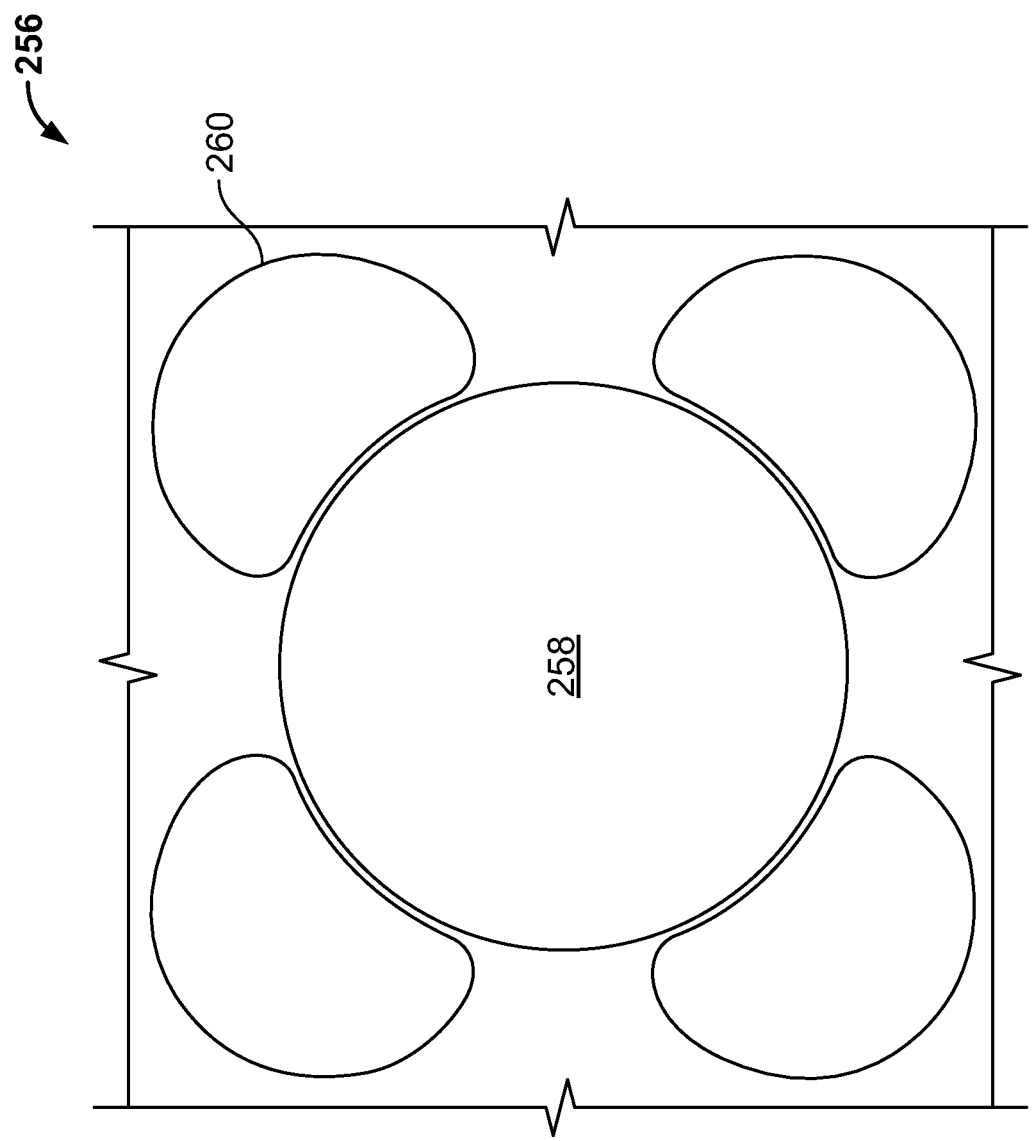
FIG. 15 is a detail plan view of a screen printing mesh pattern according to an embodiment.

FIG. 15 shows a detail of the screen printing mesh 256 that can be used for screen printing solder of the material into the recesses 216 shown in FIG. 13. Corresponding to each of the openings 216 of FIG. 13, the screen printing mesh 256 has a central region 258 which blocks the dispensing of solderable material into the via. Openings 260 which coincide with the corner regions 246 of the later individual sensor unit 200 are provided in the mesh 256 for dispensing solder paste into the recesses 216 shown in FIG. 13. Of course, the particular shape of the openings 260 may be varied according to the characteristics of the solder paste.

A method of fabricating the sensor unit 200 will now be described primarily with reference to FIG. 16.

Figure 16:
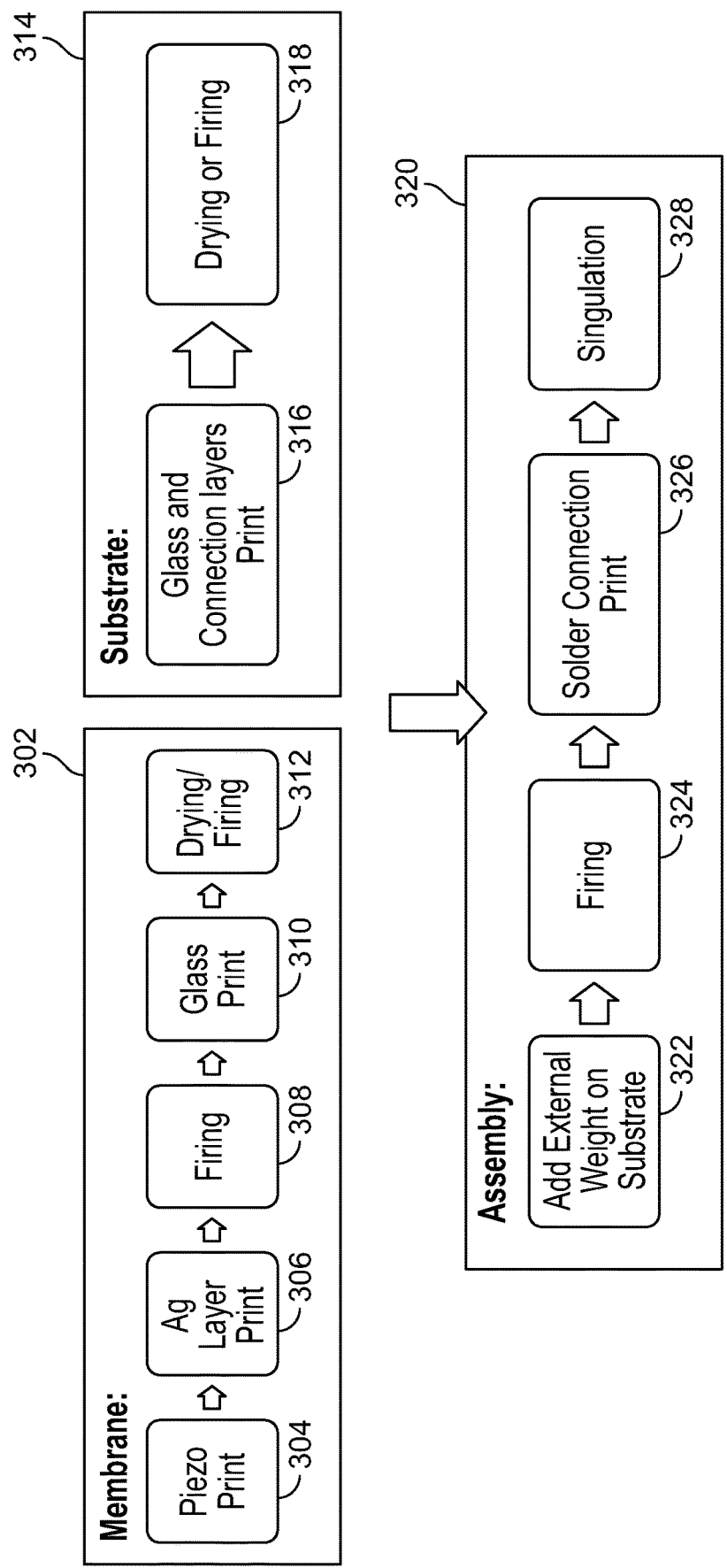
FIG. 16 is a flowchart of a process of fabricating a sensor unit according to an embodiment.

Block 302, shown in FIG. 16, describes the assembly of the sensor substrate 204. (As described above, the sensor substrate may also be referred to as a "membrane".) First, the piezoelectric layers forming the transducer elements 102 are printed onto a ceramic substrate. In step 306, a structured silver layer is printed which forms the electrically conductive leads 112 and contact pads 114, 118. In a next step 308, the membrane arrangement is fired in order to consolidate the piezoelectric layer and the conductive leads 112 and pads 114, 118. The protective glass layer 220 is added to the sensor substrate 204 in step 310. In a final drying and/or firing step 312, the sensor substrate 204 is finished.

Fabrication block 314, shown in FIG. 16, illustrates the fabrication of the circuit carrier 206, sometimes also referred to as a "substrate". In step 316 all necessary glass and connection layers are printed onto ceramic substrates. A drying and/or firing step 318 finalizes the circuit carrier. In other embodiment, additional electronic components, such as resistors or capacitors, can be integrated into the circuit carrier 206 if needed.

Fabrication block 320, shown in FIG. 16, illustrates the assembly of the membrane 204 and the substrate 206. On a panel level, the membrane 204 and the substrate 206 are aligned with each other and an additional weight is placed on the stack (step 322). In step 324, the stack is fired for effecting an adhesion between the glass layer 220 and the upper surface 242 of the circuit carrier 206.

Next, in step 326, the solder paste is screen printed into the openings 216 from the membrane side, and a reflow step may be performed for fixing the solder connection. In step 328, the individual sensor units 200 are separated from each other by known chip singulation techniques, for example, sawing, laser cutting, snapping etc. In another embodiment, the solder connections are not yet heated up in step 326, but the sensor units 200 are singulated with only the solder paste printed. In this case, the reflow step is performed together with reflow soldering the sensor unit 200 to an external component (not shown) or when attaching the electronic sensing and control circuit 238.

Figure 17:
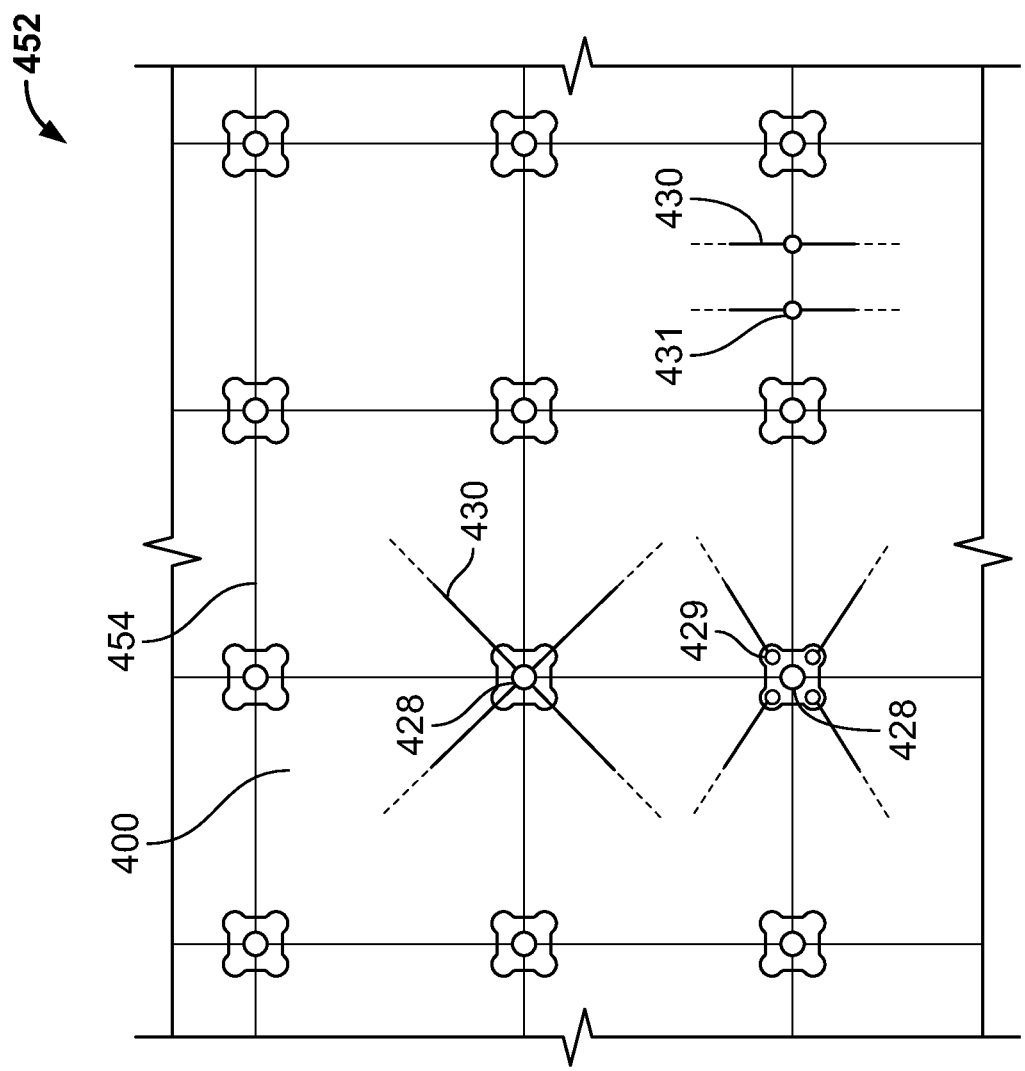
FIG. 17 is a plan view of an upper side of a panel layout pattern according to an embodiment.

FIG. 17 shows a panel 452 with the attached sensor substrate is shown. As shown in FIG. 17, a plurality of not yet individualized electric or electronic units 400 (for example sensor units 200 as described above) are arranged side by side. Several different geometries are schematically combined in this drawing. Of course, not all of these variants have to be realized on the same panel 452. FIG. 17 illustrates using vias 428 shared during the production until the individual units 400 are separated. This concept may also be used with other electrical or electronic units as well, not only with sensor units.

As shown in FIG. 17, the later corner regions are for instance located at the intersections of the die cutting lines 454. By the later cutting process, each unit 400 may have a via 428 with the quarter-circle shaped cross-section connected to an electrically conductive lead 430. As shown in FIG. 5, after the subdividing step, the metallized via 428 establishes the electrical contact between both sides of the circuit carrier. Alternatively, additional vias 429 can be provided around the central via 428, so that after the cutting step each circuit has a separate additional recess with a closed (for instance circular) cross-section similar to the arrangement shown FIG. 1.

As shown in FIG. 17, one or more castellation vias 431 may be arranged along one die cutting line 454, so that they are intersected by only one cutting line 454 instead of being the crossing point of a plurality of cutting lines 454 as shown for via 428. In this configuration, a castellation geometry along an edge of the unit's circuit carrier is generated after the cutting step.

Figure 18:
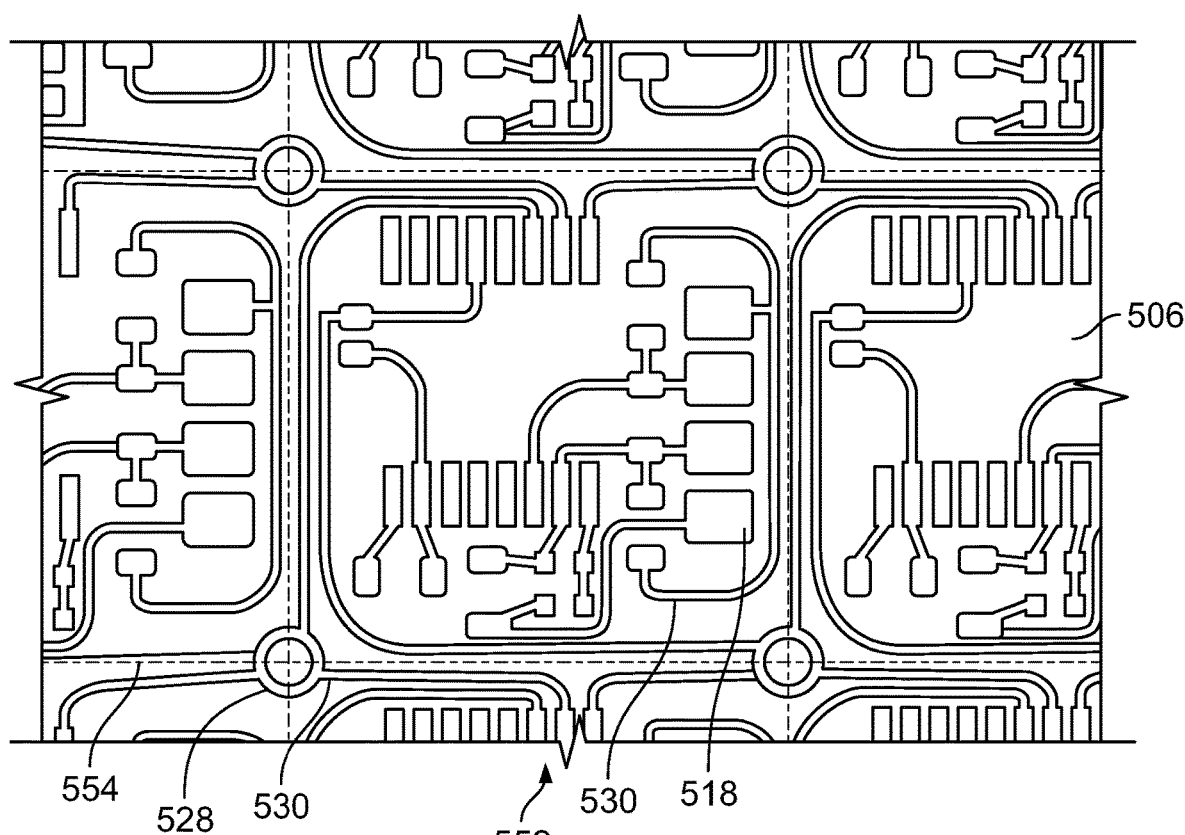
FIG. 18 is a plan view of an upper side of a circuit layout pattern according to an embodiment.

FIG. 18 illustrates the layout of a circuit carrier panel 552 according to a further embodiment. On the panel 552, a plurality of circuit carriers 506 are fabricated side-by-side by providing a circuit carrier material with electrically conductive elements. For instance, various electrically conductive contact pads 518 are arranged on this upper surface of the circuit carrier 506 for electrically contacting the sensor substrate and for attaching electric and electronic components, as will become apparent from FIGS. 20 and 21. Electrically conductive leads 530 are provided to interconnect the electric/electronic components to each other or to a via 528. By cutting the panel 552 along the grid of intersecting cutting lines 554, a plurality of separate units can be fabricated. Each of the units will then have a quarter of a via 528 at each of its corners.

The separating of the individual units will only be performed after the sensor substrates have been assembled. Before the soldering step, the inner electrically conductive surface of the vias 528 may be coated with an electrically insulating layer to avoid the solder material to enter in the via 528. The via 528 establishes an electrical connection to the opposing surface of the circuit carrier 506.

Figure 19:
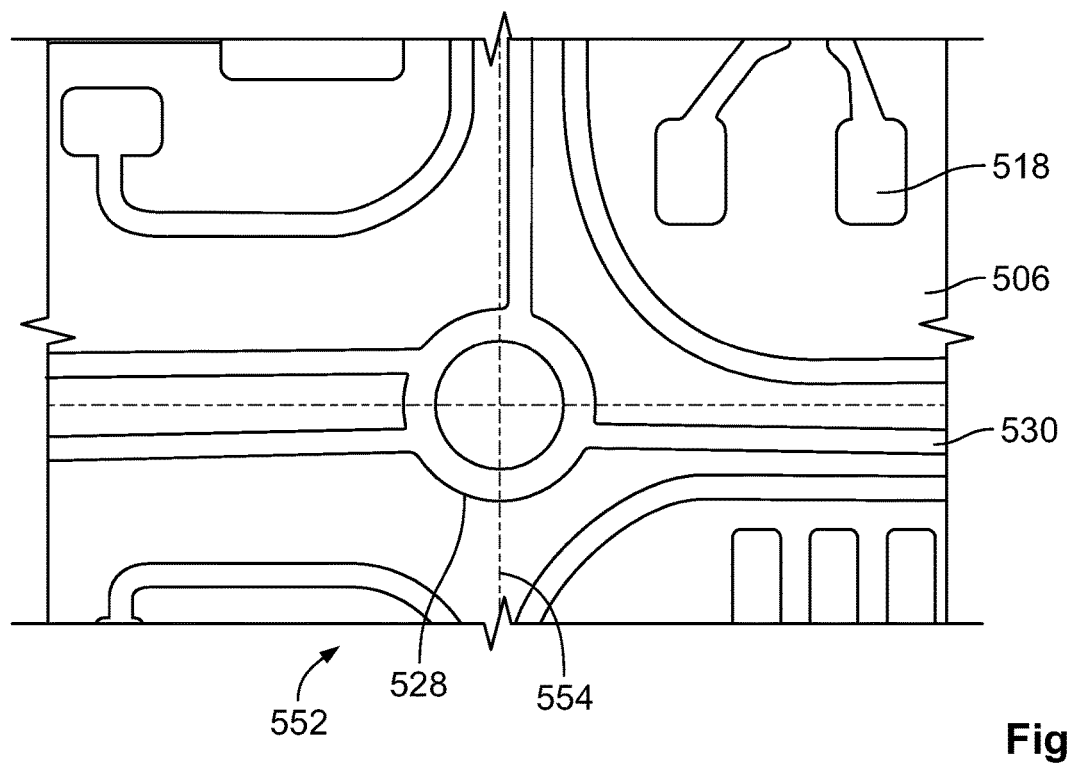
FIG. 19 is a detail view of a portion of FIG. 18.

FIG. 19 shows a detail of FIG. 18, wherein the via 528 and its surroundings are enlarged. As shown in FIG. 19, the layout of the panel 552 is designed in a way that after cutting along the cutting lines 554, each circuit carrier 506 has a quarter of the volume 528, connected to one electrically conductive lead 530. Advantageously, the electrically conductive leads which are connected to the metallization of the via 528, run in parallel to the cutting lines 554, so that they are not damaged by the cutting process. A single through hole is shared for four circuits, each corner of one unit (still in the array in FIGS. 18 and 19) takes a quarter of the metallized hole for the electrical connection from one side of the board to the other. After the soldering step and the separation step, a quarter of the metallized via 528 provides a full contact through the thickness of the circuit carrier at each corner of each finally assembled electronic unit.

Figure 10:
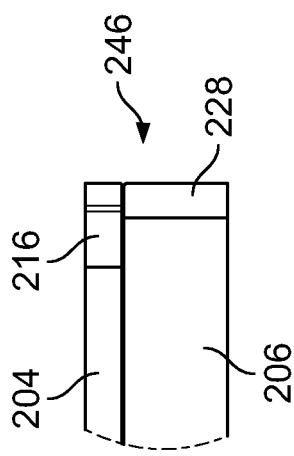
FIG. 10 is a side view of a portion of the sensor unit of FIG. 5.
Figure 20:
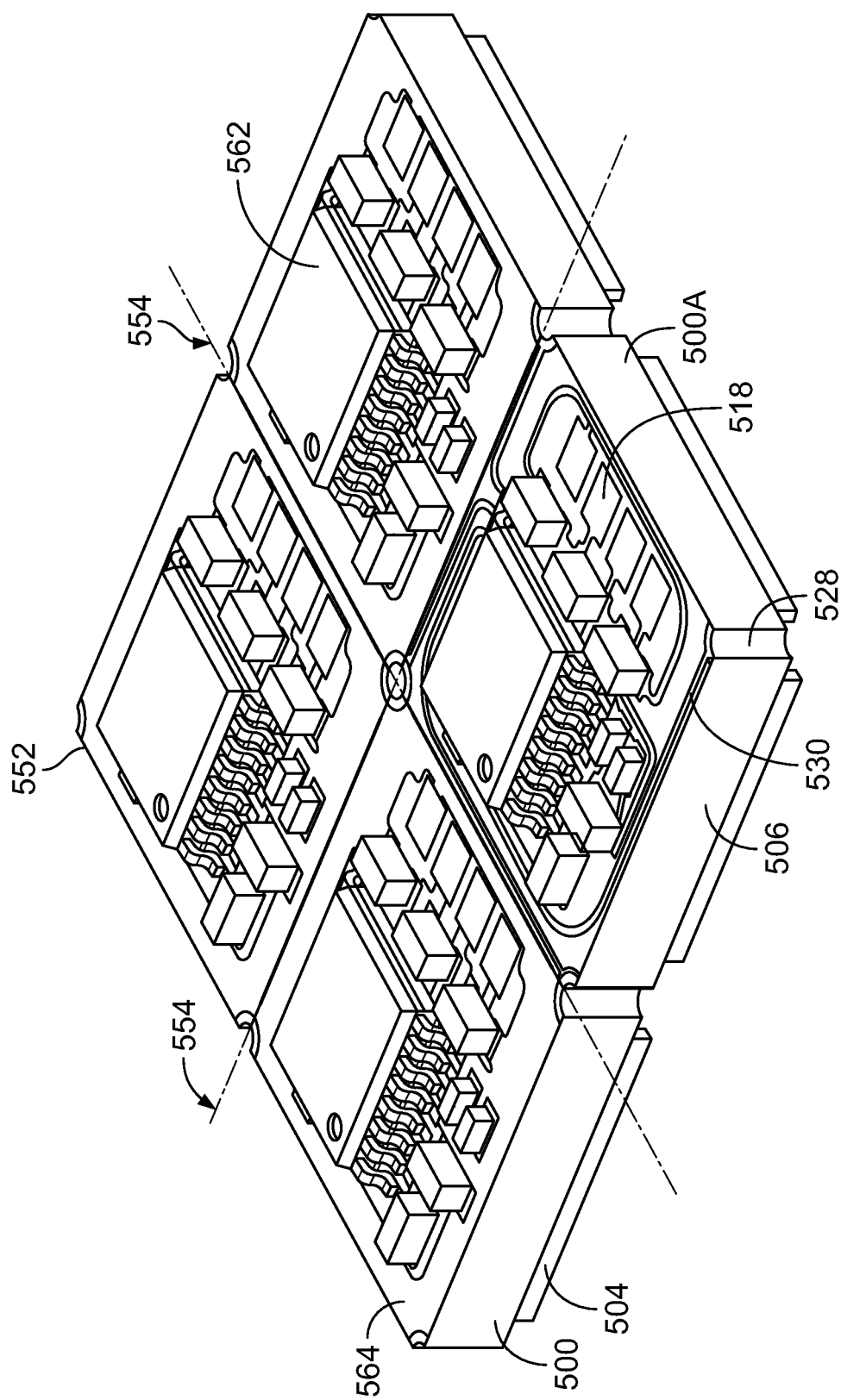
FIG. 20 is a perspective view of a portion of a panel of FIGS. 18 and 19 after electric/electronic components have been assembled and with sensor substrates attached to the circuit carriers.

On the back side of the panel 552, further contact pads 218, shown in FIG. 11, are provided, which connect to the ceramic membrane with sensing elements 204, 504 shown in FIGS. 10 and 20. The panel 552 is for instance fabricated from a ceramic material, the electrically conductive elements, such as the contact pads 518 and the leads 530, are fabricated with thick-film technology. However, in other embodiments, the panel 552 could also be a printed circuit board (PCB) formed from glass-reinforced epoxy laminate material, for instance a so-called FR4 material, with electrically conductive copper leads and metallized via holes. Any other suitable technology for fabricating a circuit carrier may as well be used. Flat flexible carriers can also be used.

FIG. 20 shows a part of the panel 552 of FIGS. 18 and 19 after electric/electronic components 562 have been assembled and with the sensor substrates 504 attached to the circuit carriers 506. According to the present invention, each via 528 is connected to four surrounding sensor substrates 504 by electrically conductive leads 530. Various passive and active components as well as electronic circuits can be arranged on the upper surface of the circuit carrier 506. In an embodiment, all the electronic circuitry is assembled on the panel 552 before separating the individual units 500 along the cutting lines 554. This facilitates the assembly process and reduces the costs.

In an embodiment, the electrically conductive leads 513 can be covered with a non-conductive protective layer 564. The protective layer 564 may leave open some of the electrically conductive pads 518, so that they remain accessible for instance for a wire bonding step or any other electrically connecting step. In the embodiment shown in FIGS. 20 and 21, only four units 500 are shown to be still interconnected in order to illustrate how the vias 528 are divided by separating the units. Of course, this array of four units usually is part of a much larger panel 552. Furthermore, sensor unit 500A is represented without having a protective layer 564 covering the leads 413 for illustrative purposes.

Figure 21:
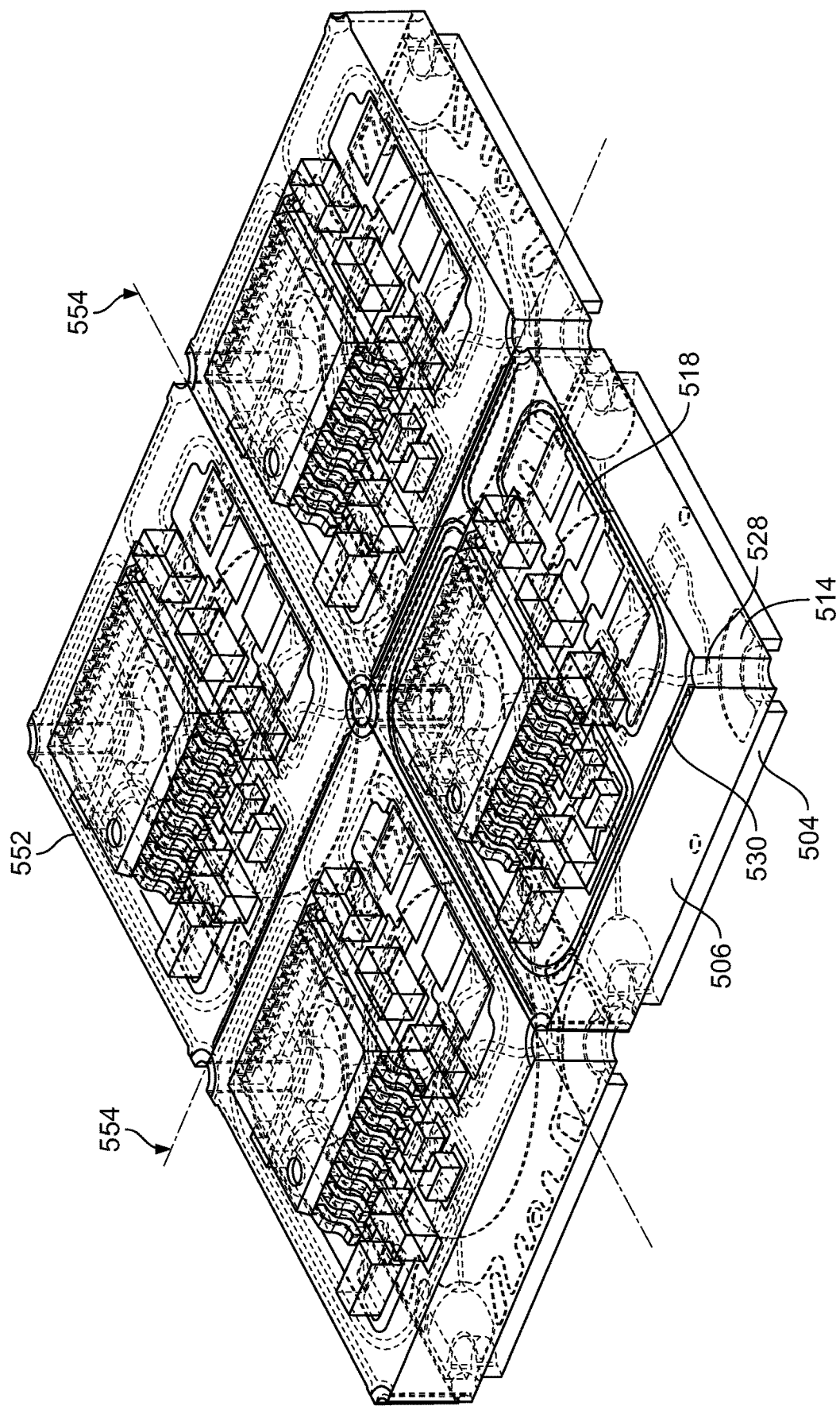
FIG. 21 is a perspective transparent view of the arrangement of FIG. 20.

FIG. 21 shows the arrangement of FIG. 20 in a transparent view so as to illustrate the sensor substrate 504 in more detail. In this depiction, it is apparent that the metallized via 528 is connected to the electrically conductive contact pad 514 arranged on the backside of carrier 506, for solder bonding the sensor substrate 504.

What is claimed is:

1. A sensor unit, comprising:
   a transducer element monitoring a measurand and generating an electrical output signal correlated with the measurand;
   a sensor substrate having a first surface and an opposite second surface, the transducer element and a first electrically conductive contact pad are arranged on the first surface, the first electrically conductive contact pad is electrically connected to the transducer element;
   a recess extending from the first surface of the substrate through to the second surface of the substrate; and
   a circuit carrier having a second electrically conductive contact pad, the sensor substrate is mounted on the circuit carrier with the first surface facing the circuit carrier, the first electrically conductive contact pad and the second electrically conductive contact pad are interconnected by an electrically conductive material filled in from the second surface towards the first surface of the sensor substrate.

2. The sensor unit of claim 1, wherein the electrically conductive material is a solder material, an electrically conductive glue, or a metal filled epoxy resin.

3. The sensor unit of claim 1, wherein the recess has a tube shape with a closed cross-section.

4. The sensor unit of claim 1, wherein the recess is arranged in a peripheral region of the sensor substrate and has an open cross-section.

5. The sensor unit of claim 1, wherein the circuit carrier has a terminal connected to the second electrically conductive contact pad.

6. The sensor unit of claim 1, wherein the transducer element is at least partially encompassed by a protective material attached to the first surface.

7. The sensor unit of claim 1, wherein the transducer element is a microelectromechanical system (MEMS) gas sensor and/or a MEMS pressure sensor.

8. The sensor unit of claim 1, wherein the sensor substrate and/or the circuit carrier is a ceramic chip carrier.

9. A method of interconnecting a substrate and a carrier to form a sensor unit, comprising:
providing a substrate having a first surface and an opposite second surface, the substrate having a first electrically conductive contact pad arranged on the first surface, the substrate has a recess extending from the first surface of the substrate through to the second surface of the substrate;
providing a circuit carrier having a second electrically conductive pad;
mounting the substrate on the circuit carrier with the first surface of the substrate facing the circuit carrier;
filling in an electrically conductive material from the second surface to the first surface through the recess; and
curing the electrically conductive material to form an electrical connection between the first electrically conductive contact pad and the second electrically conductive pad.

10. The method of claim 9, wherein the electrically conductive material is filled in by screen printing or dispensing a solder paste.

11. The method of claim 9, wherein the curing step includes heating and liquefying the electrically conductive material.

12. The method of claim 9, wherein the recess has a tube-shape with a closed cross-section.

13. The method of claim 9, wherein the recess is arranged in a peripheral region of the substrate and has an open cross-section.

14. The method of claim 9, wherein the mounting and curing steps are performed with a plurality of substrates and a plurality of circuit carriers connected to each other, forming a plurality of sensor units connected to each other.

15. The method of claim 14, further comprising separating the plurality of sensor units.

16. The method of claim 15, wherein the recesses of the substrates are each a tube-shaped via at a corner or an edge of the sensor units in a state in which the sensor units are connected to each other.

17. The method of claim 16, wherein the separating step forms the recess of each of the sensor units with an open cross-section at the corner or the edge of the sensor unit.

18. The method of claim 9, wherein the substrate is a sensor substrate having a transducer element, the transducer element monitoring a measurand and generating an electrical output signal correlated with the measurand.

19. The method of claim 18, further comprising attaching a protective material to the sensor substrate at least partly encompassing the transducer element.

* * * * *